(12) United States Patent
Suh et al.

(10) Patent No.: US 8,377,325 B2
(45) Date of Patent: Feb. 19, 2013

(54) ETCHANT FOR METAL WIRING AND METHOD FOR MANUFACTURING METAL WIRING USING THE SAME

(75) Inventors: Nam-Seok Suh, Asan-si (KR);
Sun-Young Hong, Yongin-si (KR);
Jong-Hyun Choung, Hwaseong-si (KR); Bong-Kyun Kim, Hwaseong-si (KR); Hong-Sick Park, Suwon-si (KR);
Jean-Ho Song, Yongin-si (KR);
Wang-Woo Lee, Suwon-si (KR);
Do-Won Kim, Hwaseong-si (KR);
Sang-Woo Kim, Hwaseong-si (KR);
Won-Guk Seo, Hwaseong-si (KR);
Hyun-Cheol Shin, Hwaseong-si (KR);
Ki-Beom Lee, Hwaseong-si (KR);
Sam-Young Cho, Hwaseong-si (KR)

(73) Assignee: Samsung Display Co., Ltd., Yongin (KR)

( * ) Notice: Subject to any disclaimer, the term of this patent is extended or adjusted under 35 U.S.C. 154(b) by 197 days.

(21) Appl. No.: 13/032,563

(22) Filed: Feb. 22, 2011

(65) Prior Publication Data
US 2011/0226727 A1    Sep. 22, 2011

(30) Foreign Application Priority Data
Mar. 18, 2010 (KR) .................. 10-2010-0024250

(51) Int. Cl.
*B44C 1/22* (2006.01)
*C03C 15/00* (2006.01)
*C03C 25/68* (2006.01)
*C23F 1/00* (2006.01)
*C25F 3/00* (2006.01)

(52) U.S. Cl. .............................. 216/107; 252/79.3
(58) Field of Classification Search ............... 252/79.1, 252/79.2, 79.3; 216/107
See application file for complete search history.

(56) References Cited

U.S. PATENT DOCUMENTS

| | | |
|---|---|---|
| 2004/0262569 A1 | 12/2004 | Cho et al. |
| 2008/0041813 A1 | 2/2008 | Oladeji et al. |

FOREIGN PATENT DOCUMENTS

| | | |
|---|---|---|
| JP | 06-330353 | 11/1994 |
| JP | 08-060386 | 3/1996 |
| JP | 2006-052425 | 2/2006 |
| JP | 2006-111953 | 4/2006 |
| JP | 2007-194326 | 8/2007 |
| JP | 2009-076601 | 4/2009 |
| KR | 10-0456373 | 11/2004 |
| KR | 1020050000682 | 1/2005 |
| KR | 100839428 | 6/2008 |
| KR | 1020080084539 | 9/2008 |
| KR | 1020090009382 | 1/2009 |
| KR | 1020090081545 | 7/2009 |
| KR | 1020090081936 | 7/2009 |
| KR | 1020090087210 | 8/2009 |

OTHER PUBLICATIONS

PCT Search Report dated Nov. 24, 2011 for International application No. PCT/KR2011/001060 filed on Feb. 17, 2011.

*Primary Examiner* — Roberts Culbert
(74) *Attorney, Agent, or Firm* — H.C. Park & Associates, PLC

(57) ABSTRACT

Exemplary embodiments of the present invention provide a metal wiring etchant. A metal wiring etchant according to an exemplary embodiment of the present invention includes ammonium persulfate, an organic acid, an ammonium salt, a fluorine-containing compound, a glycol-based compound, and an azole-based compound.

21 Claims, 13 Drawing Sheets

ETCHANT FOR METAL WIRING AND METHOD FOR MANUFACTURING METAL WIRING USING THE SAME

CROSS REFERENCE TO RELATED APPLICATION

This application claims priority from and the benefit of Korean Patent Application No. 10-2010-0024250, filed on Mar. 18, 2010, which is hereby incorporated by reference for all purposes as if fully set forth herein.

BACKGROUND OF THE INVENTION

1. Field of the Invention

Exemplary embodiments of the present invention relate to a metal wiring etchant and a method for manufacturing metal wiring using the same.

2. Discussion of the Background

A thin film transistor (TFT) array panel may be used as a circuit board for independently driving pixels in a liquid crystal display or an organic electro-luminescent (EL) display device.

The thin film transistor array panel may include a scanning signal line or a gate line for transmitting a scanning signal, an image signal line or a data line for transmitting an image signal, a thin film transistor connected to the gate line and the data line, and a pixel electrode connected to the thin film transistor.

The thin film transistor may include a gate electrode that is a portion of the gate wire, a semiconductor layer forming a channel, a source electrode that is a portion of the data wire, and a drain electrode.

The thin film transistor is a switching element that controls an image signal transmitted to the pixel electrode through the data wire according to the scanning signal transmitted through the gate line.

To manufacture the thin film transistor, a metal layer as a wiring material for a gate electrode or a source/drain electrode pair is deposited on a substrate, and the metal layer is etched by using a corrosive gas or a solvent to realize a desired path of the electrical circuit.

While downsizing and highly integrating the circuit, the metal wire becomes thin, however electrical resistance is relatively increased.

Accordingly, copper is increasingly gaining attention as the wiring material having low resistance instead of chromium, molybdenum, aluminum, and alloys mainly used as the conventional wiring material.

However, copper may have poor adherence with a glass substrate or a silicon insulating layer such that it is difficult to use a single layer of copper, and thereby a titanium layer having excellent adherence with the glass substrate or the silicon insulating layer may be used as a lower layer in a multilayer with copper.

To etch this multilayer, a peroxide-based etchant is used, but if the peroxide-based etchant includes metal ions at more than a predetermined concentration, peroxide decomposition is accelerated and it is quickly decomposed into water and oxygen such that heat and quick composition change may be generated, thereby generating instability.

To solve this problem of hydrogen peroxide decomposition, a peroxide solution stabilizer may be added, however the addition of the expensive stabilizer increases the cost.

The above information disclosed in this Background section is only for enhancement of understanding of the background of the invention and therefore it may contain information that does not form any part of the prior art.

SUMMARY OF THE INVENTION

Exemplary embodiments of the present invention provide an etchant for etching metal wiring, and in detail, exemplary embodiments of the present invention provide an etchant that ensures high stability and a high process margin, and simultaneously etches a copper layer with a smooth taper.

Exemplary embodiments of the present invention also provide a method of using the etchant to manufacture a metal layer.

Additional features of the invention will be set forth in the description which follows, and in part will be apparent from the description, or may be learned by practice of the invention.

An exemplary embodiment of the present invention discloses a metal wiring etchant that includes ammonium persulfate, an organic acid, an ammonium salt, a fluorine-containing compound, a glycol-based compound, and an azole-based compound.

An exemplary embodiment of the present invention also discloses a method of manufacturing metal wiring that includes forming a single layer including copper or a multi-layer including titanium and copper on a substrate, and etching the single layer or the multilayer by using an etchant, wherein the etchant includes ammonium persulfate, an organic acid, an ammonium salt, a fluorine-containing compound, a glycol-based compound, and an azole-based compound.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
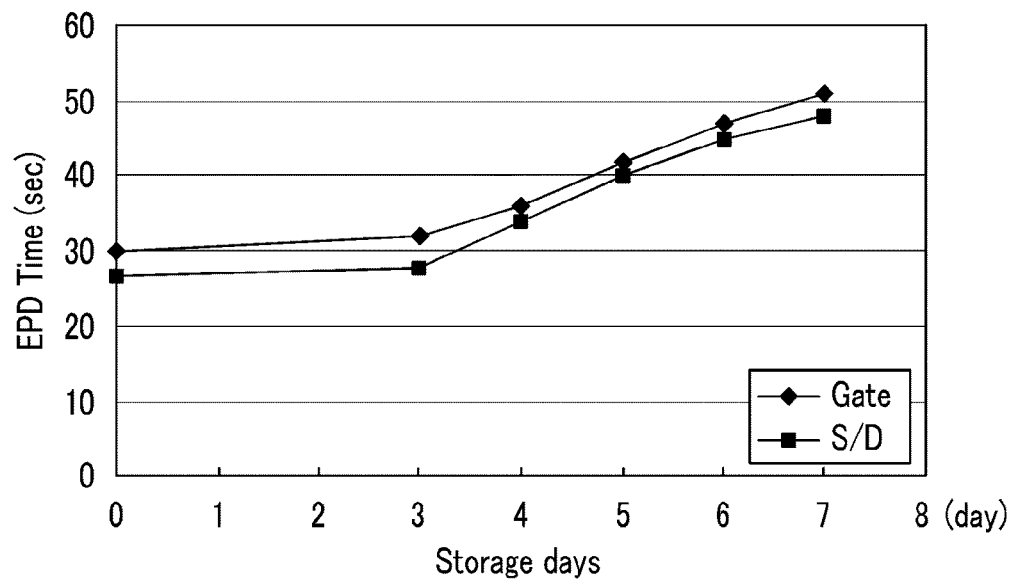
FIG. 1A is a graph showing etching point detector (EPD) time for a number of storage days related to an etchant according to a comparative example.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present.

A metal wiring etchant according to an exemplary embodiment of the present invention includes ammonium persulfate ($(NH_4)_2S_2O_8$; APS), an organic acid, a fluorine-containing compound, an ammonium salt, a glycol-based compound, an azole-based compound, and water as a remaining part.

Ammonium persulfate as an oxidant is a main component for etching a copper layer, and etches the copper layer by a reaction like Reaction Equation 1 such that a stable compound may be formed.

$$S_2O_8^{-2} + 2Cu \rightarrow 2CuSO_4 \qquad \text{Reaction Equation 1}$$

In an exemplary embodiment of the present invention, ammonium persulfate having sufficient purity for a semiconductor process may be used.

In the etchant according to an exemplary embodiment of the present invention, ammonium persulfate may be present in a range from 0.1 to 30 wt % compared with the weight of the etchant.

In the etchant, when the ammonium persulfate is added at less than 0.1 wt %, etching of the copper layer is difficult, and when adding ammonium persulfate at more than 30 wt %, the etching speed of the copper layer is very quick such that process control is difficult.

In an exemplary embodiment of the present invention, an organic acid as an assistance oxidant etching the copper layer functions as a chelating agent, preventing deterioration of the etching speed by copper ions eluted in the copper etching process.

In an exemplary embodiment of the present invention, the kind of the organic acid is not limited, however, representatively there are oxalic acid, oxalacetic acid, fumaric acid, malic acid, succinic acid, acetic acid, butyric acid, palmitic acid, tartaric acid, ascorbic acid, uric acid, sulphonic acid, sulfinic acid, formic acid, citric acid, isocitric acid, α-ketoglutaric acid, and glycolic acid, but it is particularly preferable that citric acid and glycolic acid are used simultaneously.

In an exemplary embodiment of the present invention, an organic acid having sufficient purity for a semiconductor process may be used.

In the etchant according to an exemplary embodiment of the present invention, the organic acid may be present in the range from 0.1 to 30 wt % compared with the weight of the etchant.

In the etchant, when the organic acid is added at less than 0.1 wt %, the etchant does not function as the assistance oxidant, and when adding the organic acid at more than 30 wt %, the etching speed of the copper layer is very quick such that disconnection of the wiring may be generated.

In an exemplary embodiment of the present invention, for the ammonium salt as the main component for increasing a taper angle of the copper layer by controlling the etching speed of the copper layer, the kind thereof is not limited, however there are $CH_3COONH_4$, $NH_4NO_3$, $(NH_4)_2HPO_4$, $NH_4H_2PO_4$, $NH_4PO_4$, and $(NH_4)_2SO_4$ as the compound that is capable of dissociating by $NH_4^+$, and it is particularly preferable that $CH_3COONH_4$ and $NH_4H_2PO_4$ are used simultaneously.

In an exemplary embodiment of the present invention, an ammonium salt having sufficient purity of a semiconductor process may be used.

In the etchant according to an exemplary embodiment of the present invention, the ammonium salt may be present in the range from 0.01 to 5 wt % compared with the weight of the etchant.

In the etchant, when the ammonium salt is added at less than 0.1 wt %, the etching speed control of the copper layer is difficult, when adding ammonium salt at more than 5 wt %, the etching of the copper layer is non-uniform or the copper layer may not be etched.

In an exemplary embodiment of the present invention, the fluorine-containing compound as the main component for etching the titanium layer under the copper layer is referred to as a compound including fluorine.

The kind thereof is not limited, however in an exemplary embodiment of the present invention, examples of the fluorine-containing compound are HF, NaF, $NaHF_2$, $NH_4F$, $NH_4HF_2$, $NH_4BF_4$, KF, $KHF_2$, $AlF_3$, $HBF_4$, $LiF_1$, $KBF_4$, and $CaF_2$.

In the etchant according to an exemplary embodiment of the present invention, the fluorine-containing compound may be present in the range from 0.01 to 5 wt %.

In the etchant, if the fluorine-containing compound is present at less than 0.01 wt %, the etching of the titanium layer is difficult, and if it is added at more than 5 wt %, the glass and the insulating layer under the titanium layer may be etched such that deterioration may be generated.

In an exemplary embodiment of the present invention, the glycol-based compound as the main component for controlling the etching speed of the copper layer to be slow such that the CD skew is reduced and the taper angle is increased has the characteristic of suppressing the etching of the glass or the insulating layer thereunder.

In an exemplary embodiment of the present invention, the kind of the glycol-based compound is not limited, however it may be represented as $R_1R_2H$.

Herein, $R_1$ is OH or $CH_3(CX_2)_nO$, X is one of H, OH, and $CH_3$, n is 0 to 7, $R_2$ is $(CH_2CH_2O)_m$ or $(CHCH_3CH_2O)_m$, and m is 1 to 8.

In an exemplary embodiment, n is 0 to 3, and m is 1 to 4.

In the etchant of the present invention, the glycol-based compound is present in the range from 0.01 to 10 wt %.

In the etchant, if the glycol-based compound is present at less than 0.01 wt %, it is difficult to control the etching speed of the copper layer, if it is present at more than 10 wt %, the etching of the copper layer is difficult.

In an exemplary embodiment of the present invention, the azole-based compound is referred to as a 5-membered heterocycle compound including nitrogen as an element and having at least one other heteroatom included in the cycle.

In an exemplary embodiment of the present invention, non-limiting examples of the azole-based compound are benzotriazole, aminotetrazole, imidazole, and pyrazole.

In the etchant according to an exemplary embodiment of the present invention, the azole-based compound may be present in the range from 0.01 to 2 wt %.

The azole-based compound has the function of controlling the etching speed between the metals in the multilayer including the copper and the different metals by suppressing the etching of the copper layer such that a cut dimension (CD) loss of the wiring is reduced, and thereby the metal wiring is used as a gate wire and a data wire.

When the azole-based compound is not included in the etchant according to an exemplary embodiment of the present invention, the etching speed for the copper may not be controlled and the CD loss is increased such that linearity of the wiring may also be deteriorated, and thereby serious problems may be generated under the application of the production process.

Although there is no explicit description, in an exemplary embodiment of the present invention, water may be present in an amount to make up 100 wt % including the other components in the etchant.

The water used in an exemplary embodiment of the present invention may have sufficient purity for a semiconductor process, or may be deionized water.

In the range of the etchant or etchant composition as described above, the etchant that is included in the range of the weight ratio as described above is included, and even if the composition is out of the weight ratio range or there are substitutions of some of the above-mentioned components, if the fact that the modified constitution is substantially the same as the etchant composition is apparent to those who are skilled in the art, this constitution is included therein.

FIG. 1A is a graph showing EPD time for a number of storage days related to an etchant according to a comparative example.

Figure 1B:
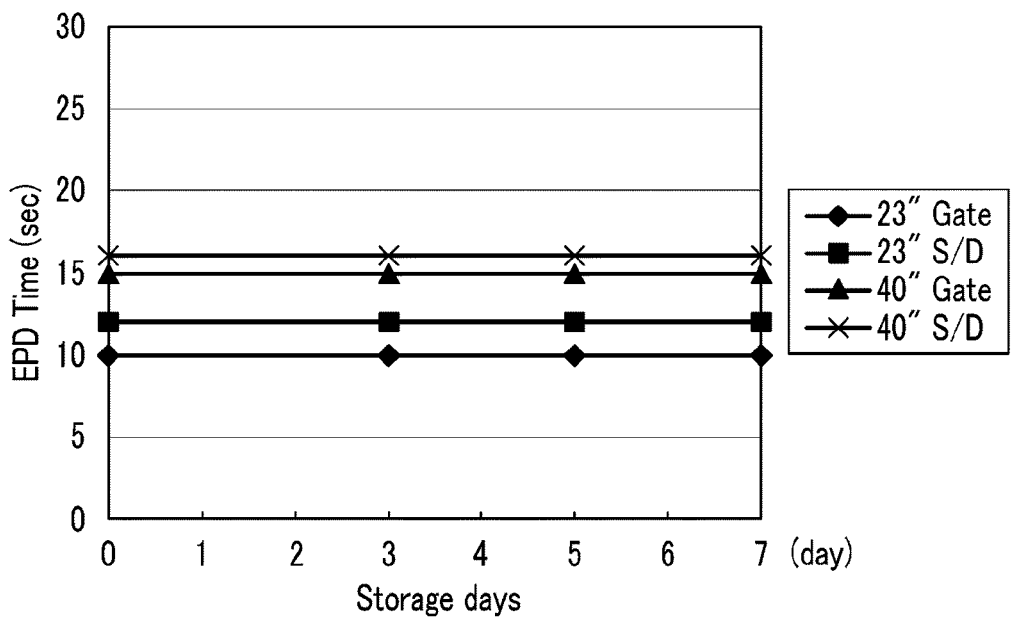
FIG. 1B is a graph showing EPD time for a number of storage days related to an etchant according to an exemplary embodiment of the present invention.

FIG. 1B is a graph showing EPD time for a number of storage days related to an etchant according to an exemplary embodiment of the present invention.

Figure 2A:
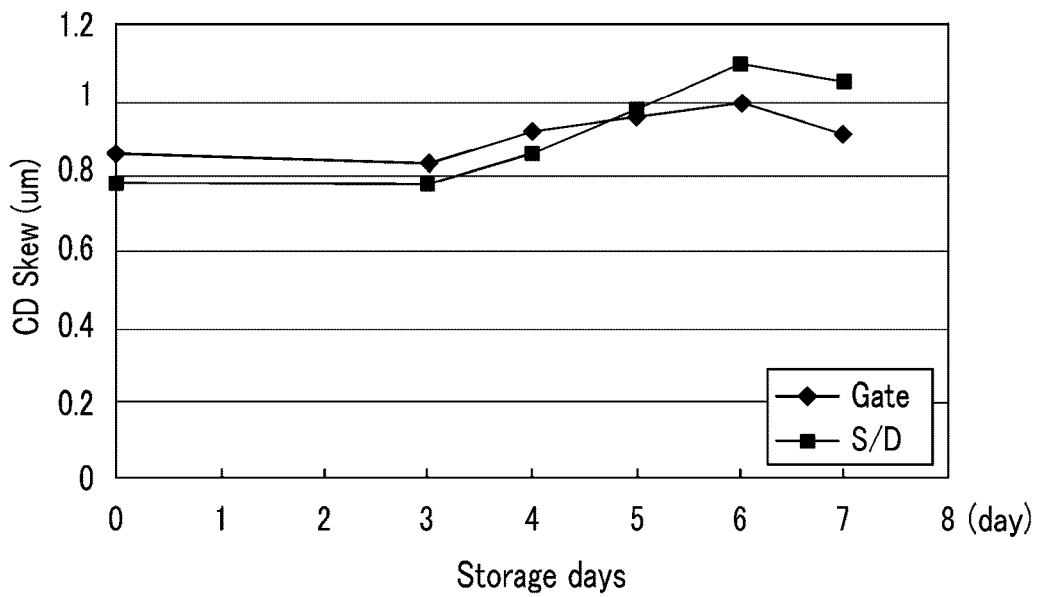
FIG. 2A is a graph showing a cut dimension (CD) skew for a number of storage days related to an etchant according to a comparative example.

FIG. 2A is a graph showing CD skew for a number of storage days related to an etchant according to a comparative example.

Figure 2B:
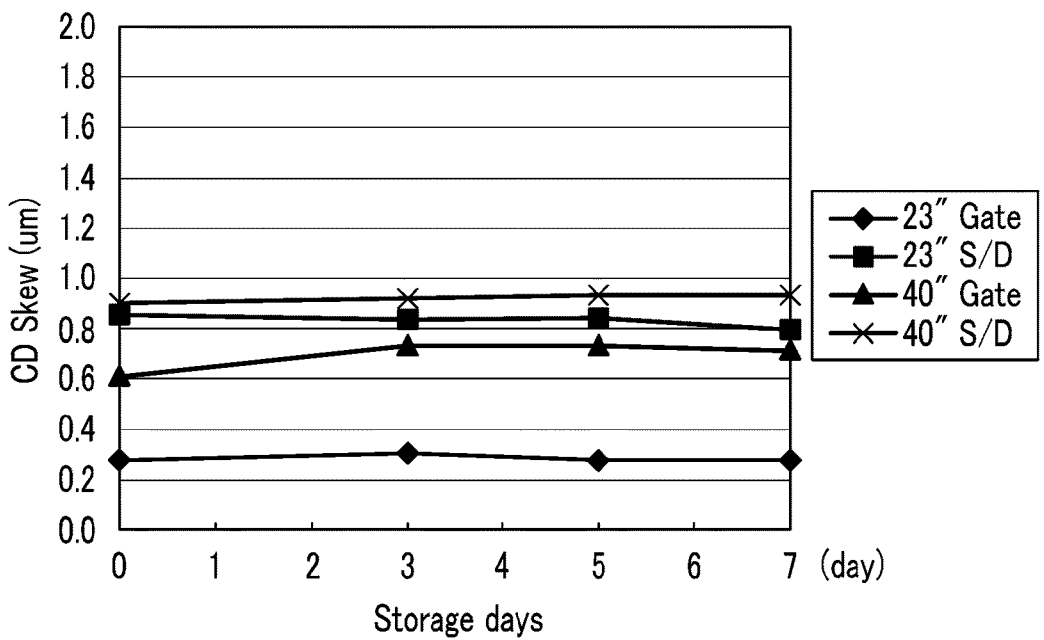
FIG. 2B is a graph showing CD skew for a number of storage days related to an etchant according to an exemplary embodiment of the present invention.

FIG. 2B is a graph showing CD skew for a number of storage days related to an etchant according to an exemplary embodiment of the present invention.

Figure 3A:
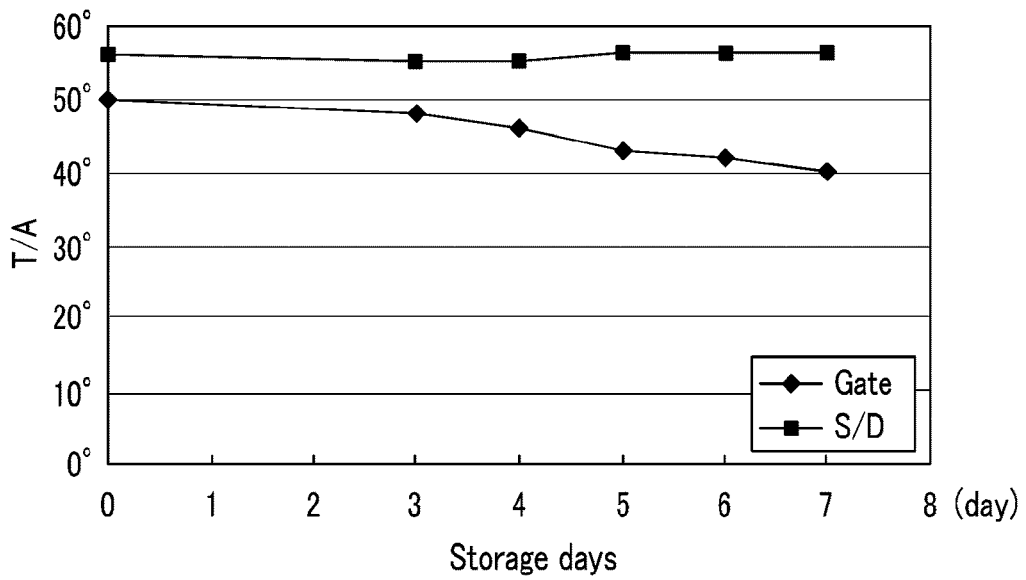
FIG. 3A is a graph showing a taper angle for a number of storage days related to an etchant according to a comparative example.

FIG. 3A is a graph showing a taper angle for a number of storage days related to an etchant according to a comparative example.

Figure 3B:
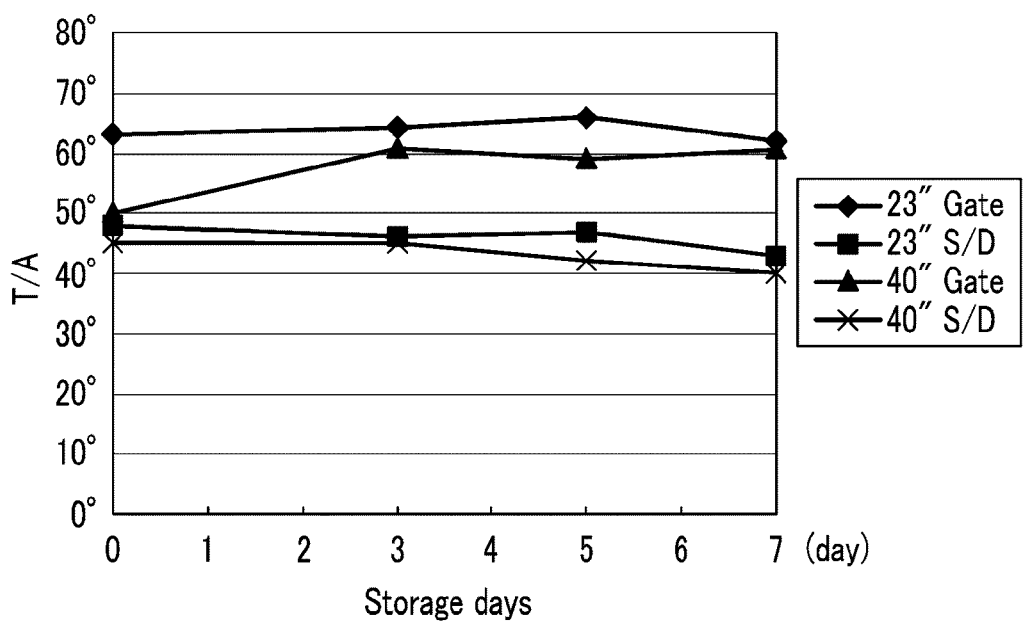
FIG. 3B is a graph showing a taper angle for a number of storage days related to an etchant according to an exemplary embodiment of the present invention.

FIG. 3B is a graph showing a taper angle for a number of storage days related to an etchant according to an exemplary embodiment of the present invention.

Figure 4:
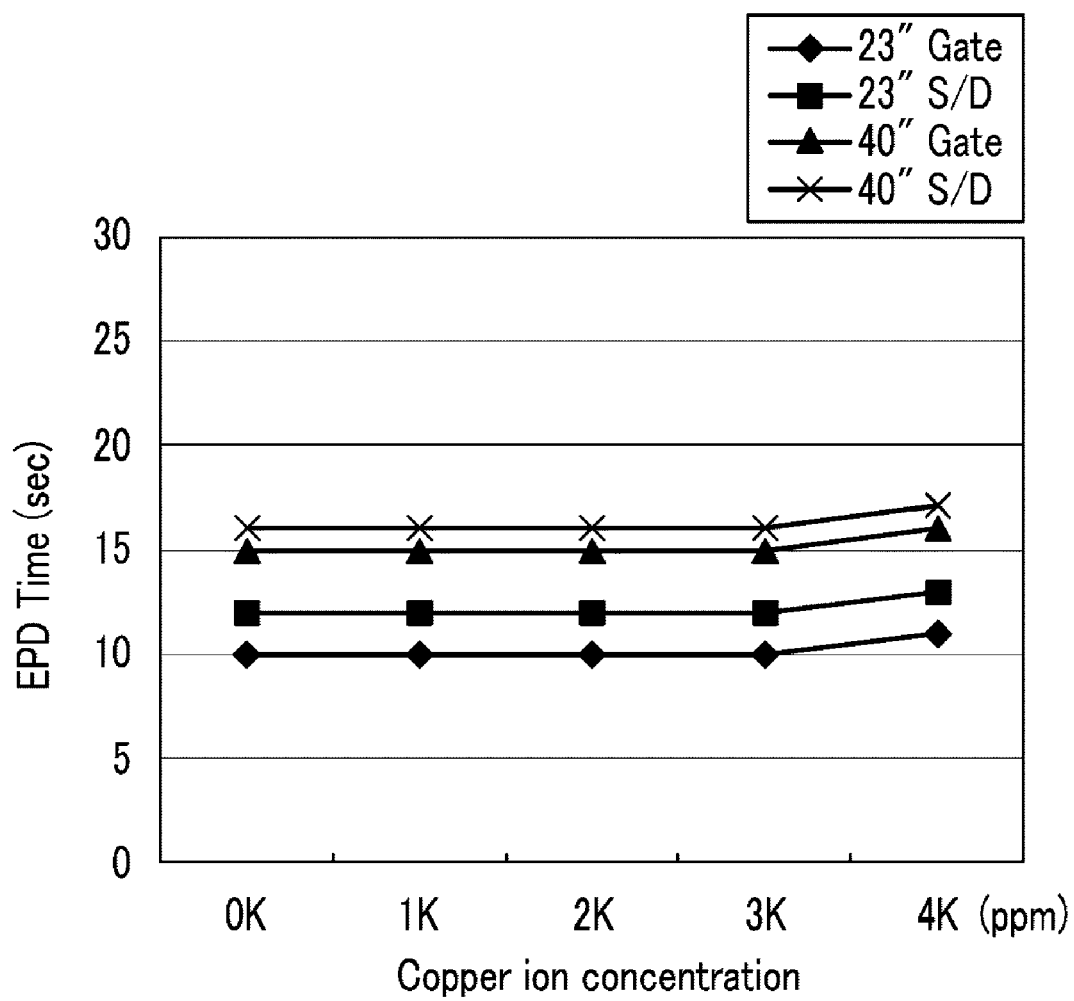
FIG. 4, FIG. 5 and FIG. 6 are graphs respectively showing EPD time, CD skew, and a taper angle for copper ion concentration related to an etchant according to an exemplary embodiment of the present invention.
Figure 5:
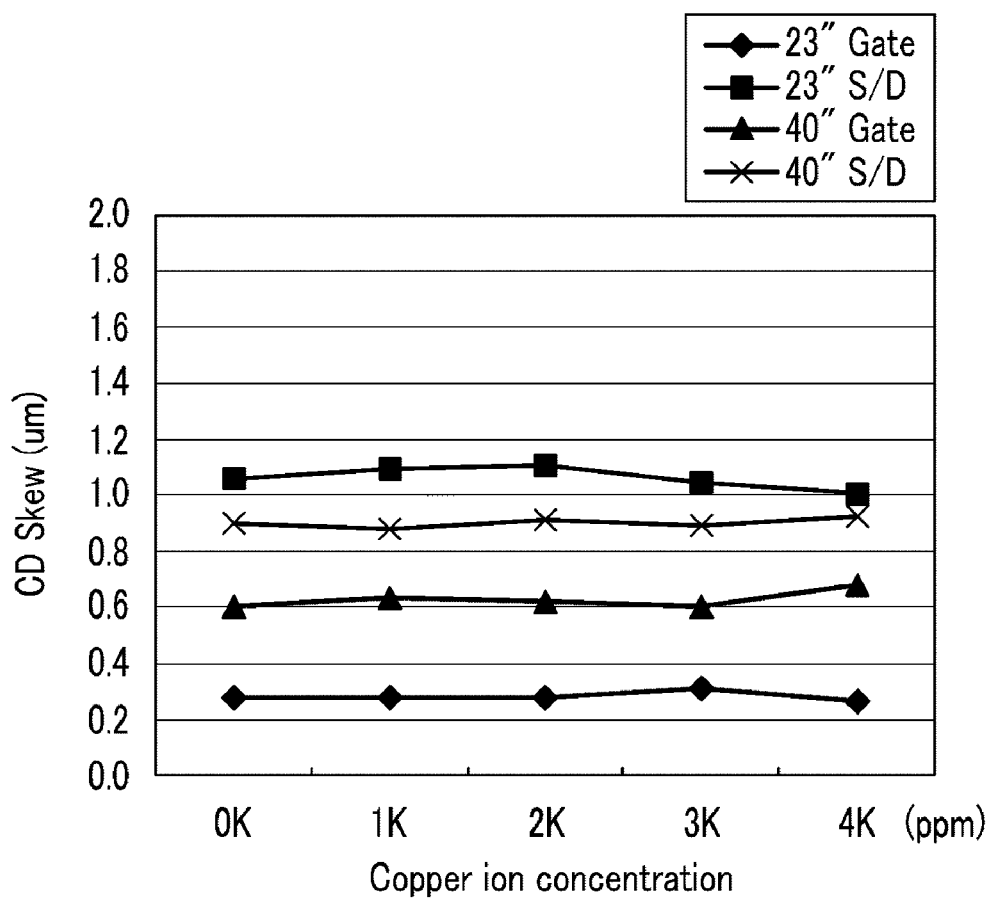
Figure 6:
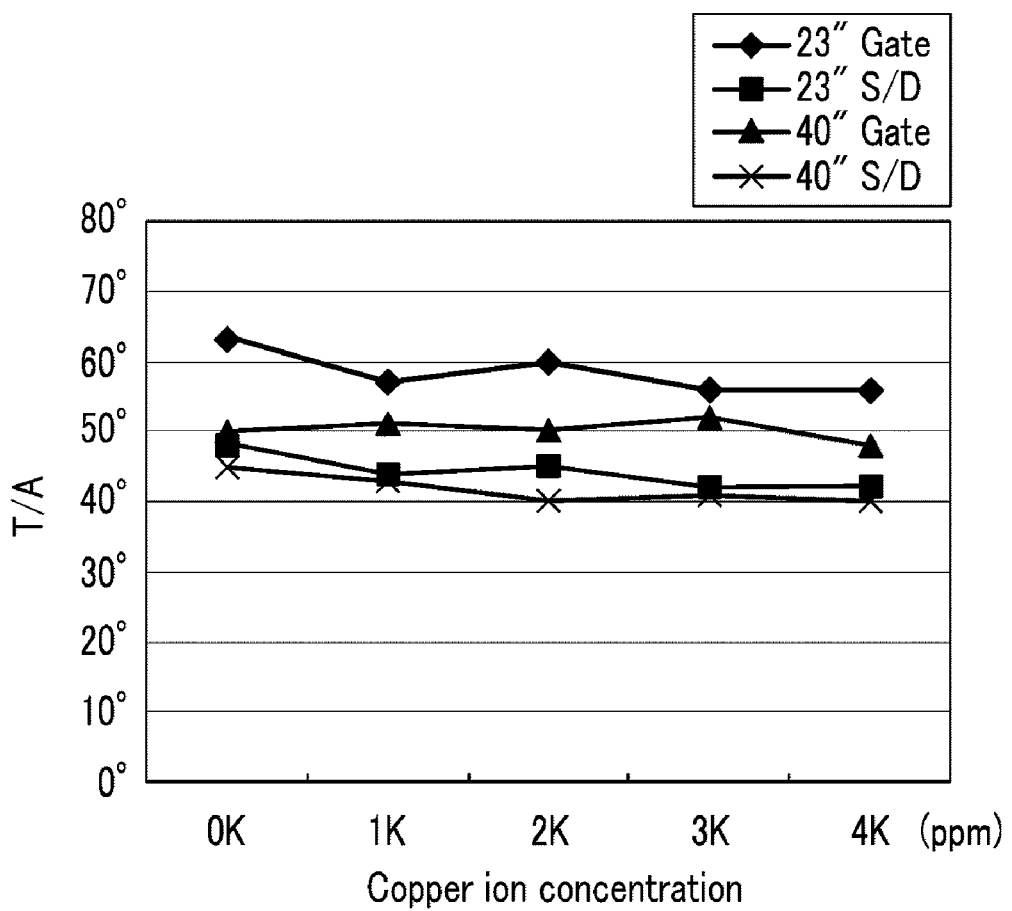
Figure 7:
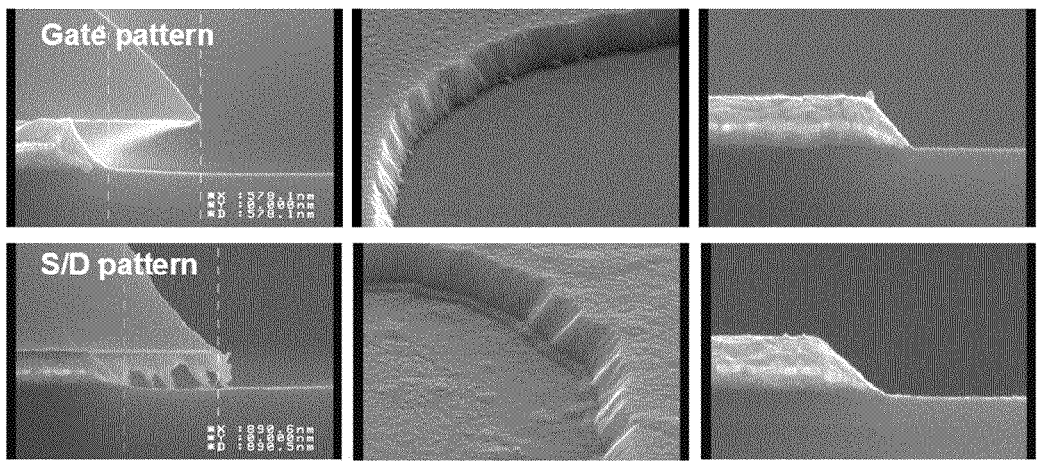
FIG. 7, FIG. 8, FIG. 9, FIG. 10, FIG. 11, FIG. 12, FIG. 13, FIG. 14, FIG. 15 and FIG. 16 are microscope photographs showing a side surface of a copper layer of a titanium/copper multilayer etched by an etchant of Exemplary Embodiment 1, Exemplary Embodiment 2, Exemplary Embodiment 3, Exemplary Embodiment 4, Exemplary Embodiment 5, Exemplary Embodiment 6, Exemplary Embodiment 7, Exemplary Embodiment 8, Exemplary Embodiment 9, and Exemplary Embodiment 10 of the present invention, respectively.
Figure 8:
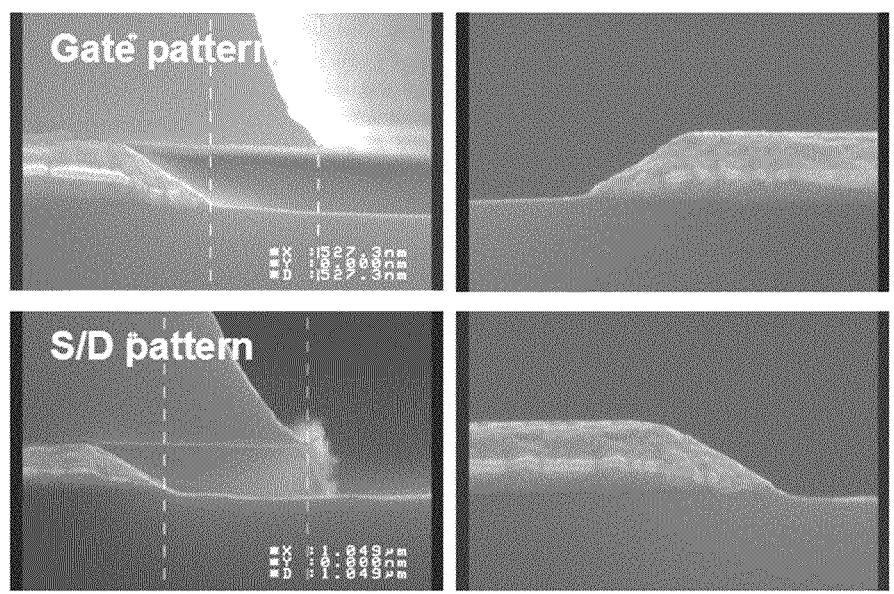
Figure 9:
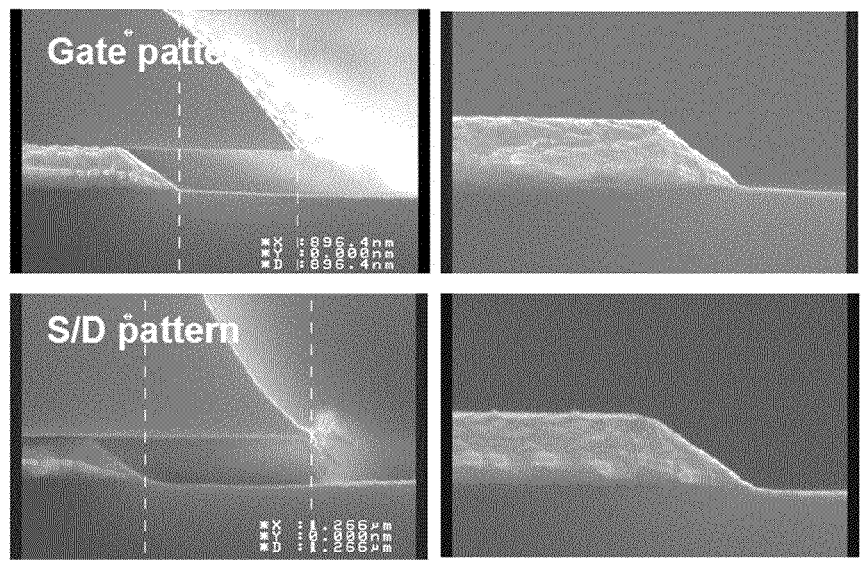
Figure 10:
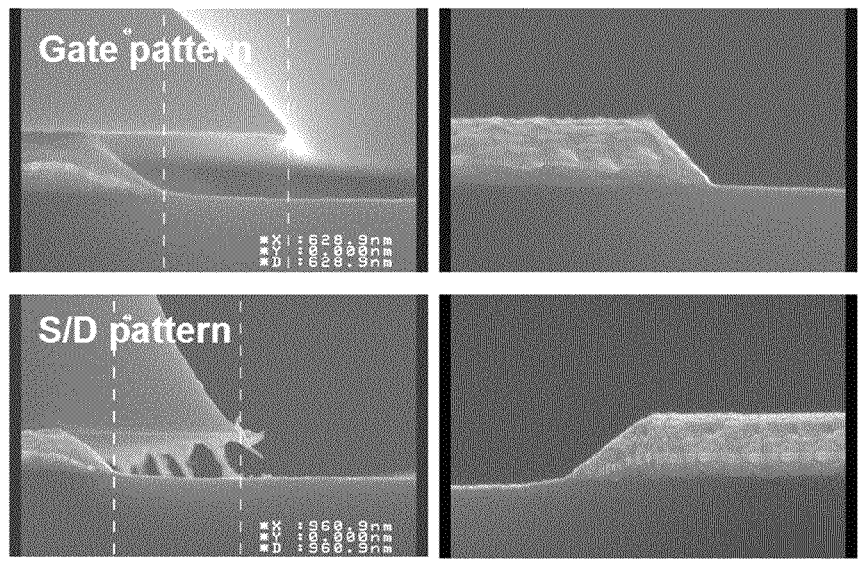
Figure 11:
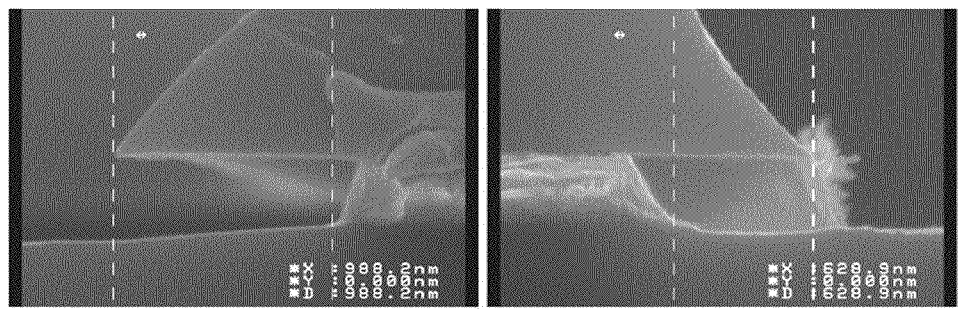
Figure 12:
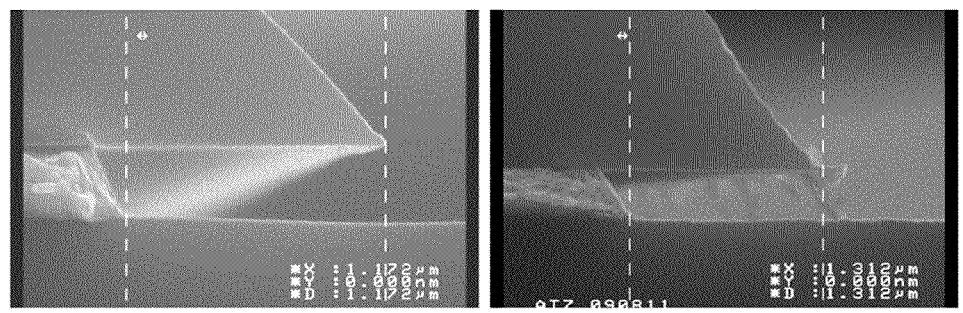
Figure 13:
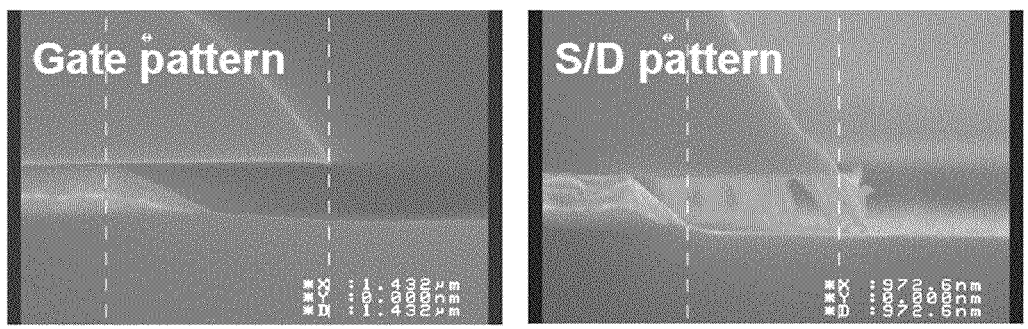
Figure 14:
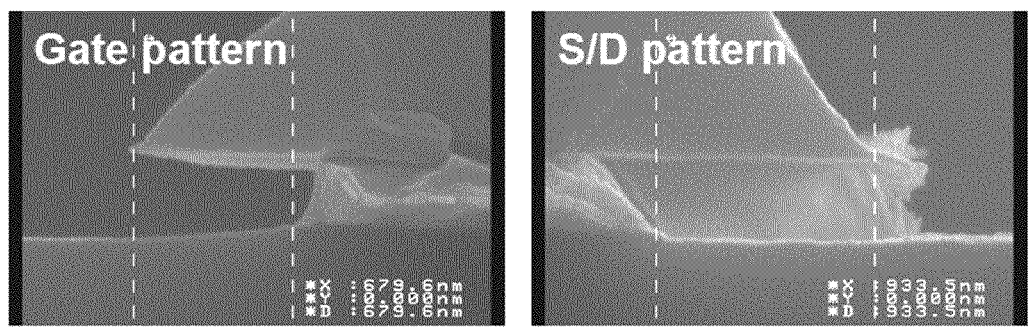
Figure 15:
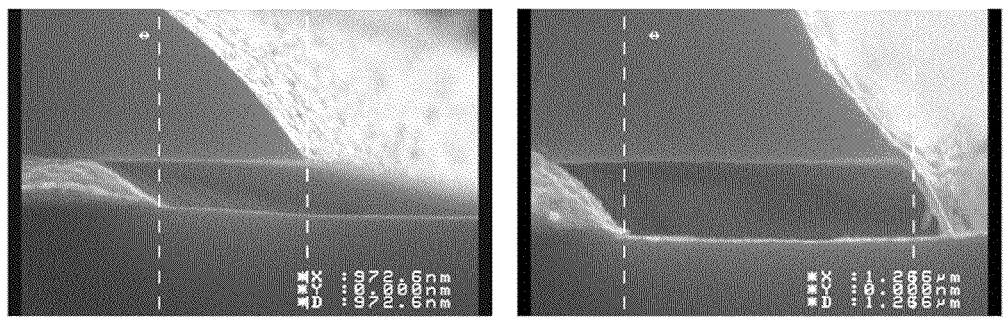
Figure 16:
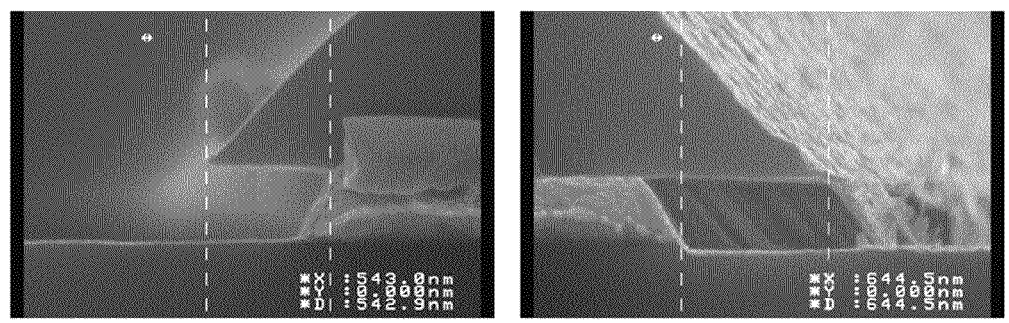

FIG. 4, FIG. 5 and FIG. 6 are graphs respectively showing EPD time, CD skew, and a taper angle for a copper ion concentration related to an etchant according to an exemplary embodiment of the present invention.

Next, an effect according to an exemplary embodiment of the present invention will be described with reference to FIG. 1 to FIG. 6 compared with a comparative example.

Comparative Example

A metal wiring etchant corresponding to a comparative example includes ammonium persulfate, an inorganic acid, an acetic salt, a fluorine-containing compound, and an azole-based compound.

A titanium/copper multilayer is formed on a substrate, a photoresist pattern is formed thereon, and the multilayer is patterned by using the etchant corresponding to the comparative example.

The multilayer is formed and patterned on the substrate to form a gate line and a is source/drain electrode.

Referring to FIG. 1A, FIG. 2A, and FIG. 3A, after three days of room temperature storage, the EPD time (etching point detector time) is increased, the CD skew is increased, and the taper angle is decreased such that it may be confirmed that the etching characteristics are deteriorated according to the passage of the time.

This is because ammonium persulfate (APS) used as the oxidant is easily discomposed at room temperature such that the etching ratio for copper is decreased.

[Exemplary Embodiment]

A metal wiring etchant according to an exemplary embodiment of the present invention includes ammonium persulfate (APS), an organic acid, an ammonium salt, a fluorine-containing compound, a glycol-based compound, and an azole-based compound.

In the metal wiring etchant according to the exemplary embodiment, compared with the comparative example, the inorganic acid is replaced with the organic acid, the acetic salt is replaced with the ammonium salt, and the glycol-based compound is added.

The multilayer of titanium/copper is formed on the substrate, the photoresist pattern is formed thereon, and the multilayer is etched by using the etchant.

Here, the etching process is executed for a panel with a size of 23" and 40", respectively and the multilayer is formed and etched on the substrate as the gate lines and the source/drain electrodes.

Referring to FIG. 1B, FIG. 2B, and FIG. 3B, after seven days of room temperature storage, the deviation for the EPD time, the CD skew, and the taper angle has not been largely generated such that it may be confirmed that the etching characteristics are maintained during storage for a long time compared with the comparative example.

As described above, the metal wiring etchant according to an exemplary embodiment of the present invention uses the organic acid instead of the inorganic acid such that the etching deterioration of the increasing of the copper ions is improved, and the ammonium salt for increasing the taper angle T/A and the glycol-based compound to control the taper angle and the etching speed are added such that the etching characteristics may be improved.

FIG. 4, FIG. 5 and FIG. 6 are graphs showing an influence on etching capability according to an increase of copper ions in the etchant with regard to the number of etching treatments of metal wiring that can be undertaken.

That is, the EPD time, the CD skew, and the taper angle are measured with a concentration of copper ions of 1000 ppm, 2000 ppm, 3000 ppm, and 4000 ppm.

Referring to FIG. 4, FIG. 5 and FIG. 6, for the metal wiring etchant according to an exemplary embodiment of the present invention, the etching characteristics are not largely changed when the copper ion concentration is increased up to 4000 ppm such that it may be confirmed that the initial performance may be maintained even when many titanium/copper multilayers are etched.

FIG. 7, FIG. 8, FIG. 9, FIG. 10, FIG. 11, FIG. 12, FIG. 13, FIG. 14, FIG. 15 and FIG. 16 are microscope photographs showing a side surface of a copper layer of a titanium/copper multilayer etched by an etchant of Exemplary Embodiment 1, Exemplary Embodiment 2, Exemplary Embodiment 3, Exemplary Embodiment 4, Exemplary Embodiment 5, Exemplary Embodiment 6, Exemplary Embodiment 7, Exemplary Embodiment 8, Exemplary Embodiment 9, and Exemplary Embodiment 10 of the present invention, respectively.

Figure 17:
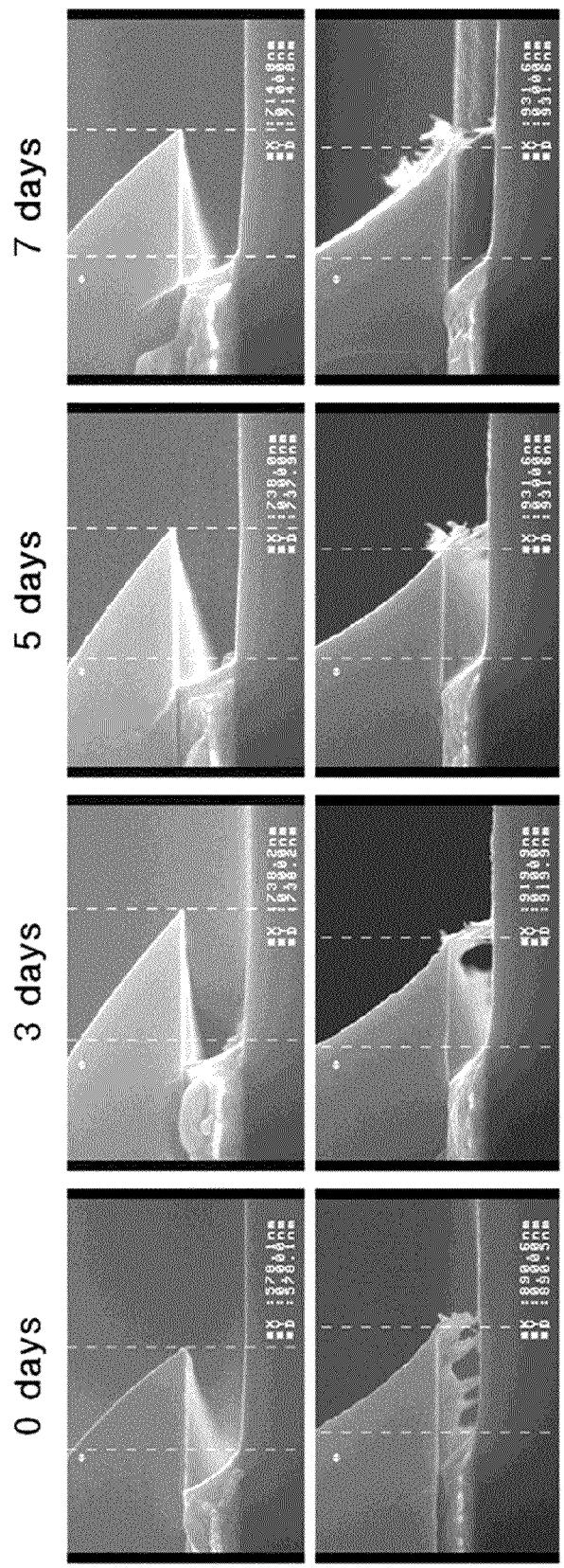
FIG. 17 is a microscope photograph showing a side surface of a copper layer etched in an experiment of etching a titanium/copper multilayer by an etchant of Exemplary Embodiment 1 of the present invention according to a number of days of room temperature storage.

FIG. 17 is a microscope photograph showing a side surface of a copper layer etched in an experiment of etching a titanium/copper multilayer by an etchant of Exemplary is Embodiment 1 of the present invention according to number of days of room temperature storage.

Figure 18:
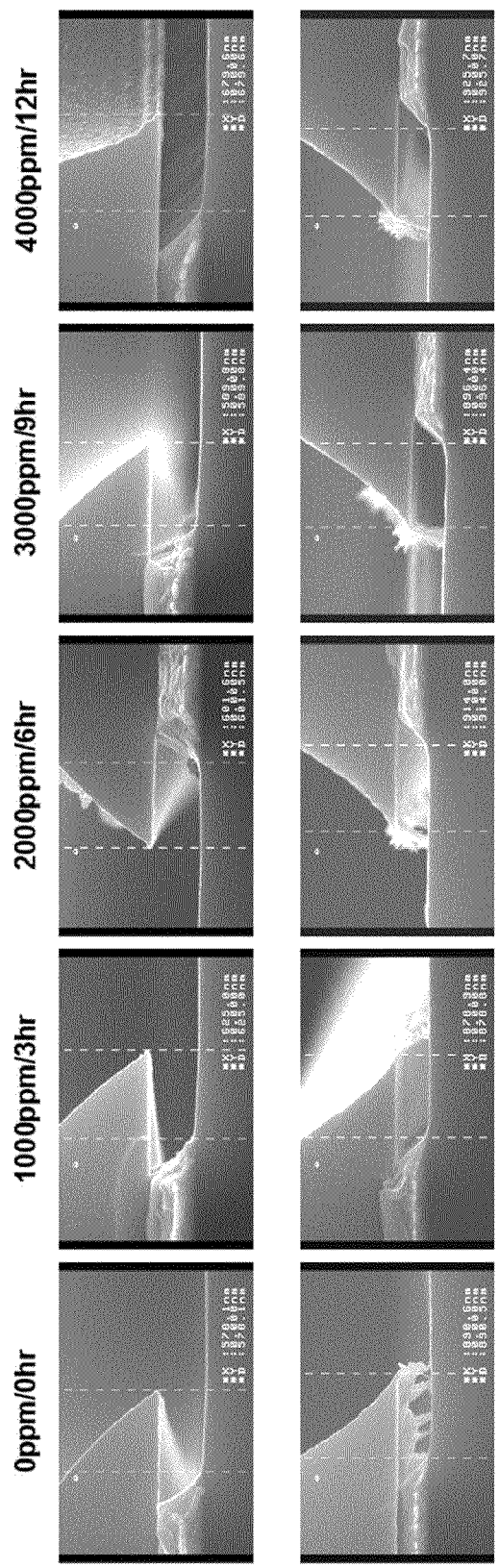
FIG. 18 is a microscope photograph showing a side surface of a copper layer in a titanium/copper multilayer etched by an etchant of Exemplary Embodiment 1 of the present invention compared to the etchant of Exemplary Embodiment 1 at various contaminating copper ion concentrations.

FIG. 18 is a microscope photograph showing a side surface of a copper layer in a titanium/copper multilayer etched by an etchant of Exemplary Embodiment 1 of the present invention (0 ppm/0 hr) compared to the etchant of Exemplary Embodiment 1 at increasing contaminating copper ion concentrations after increasing periods of time of storage (1000 ppm/3 hr), (2000 ppm/6 hr), (3000 ppm/9 hr) and (4000 ppm/12 hr) to simulate many etching treatments of a copper layer in a titanium/copper multilayer.

Hereafter, a metal wiring etchant according to an exemplary embodiment of the present invention will be described in detail with reference to Table 1, Table 2, Table 3, Table 4, Table 5 and Table 6 and FIG. 7, FIG. 8, FIG. 9, FIG. 10, FIG. 11, FIG. 12, FIG. 13, FIG. 14, FIG. 15, FIG. 16, FIG. 17 and FIG. 18.

Configurations of the following exemplary embodiments are for better understanding of the present invention, and are not to be construed to limit the technical range of the present invention through shapes or ranges provided in the exemplary embodiments in any case.

Etchants according to exemplary embodiments of the present invention were manufactured according to Exemplary Embodiment 1, Exemplary Embodiment 2, Exemplary Embodiment 3 and Exemplary Embodiment 4 as shown in Table 1, and etching performances thereof were compared.

Components of Exemplary Embodiment 1, Exemplary Embodiment 2, Exemplary Embodiment 3 and Exemplary Embodiment 4 are represented in Table 1, and all numbers are wt % units.

TABLE 1

| | APS | Organic acid 1 | Organic acid 2 | Ammonium salt | Fluorine-containing compound | Glycol-based compound | Azole-based compound |
|---|---|---|---|---|---|---|---|
| Exemplary Embodiment 1 | 6 | 20 | 2 | 0.5 | 0.5 | 2 | 0.3 |
| Exemplary Embodiment 2 | 6 | 20 | 2 | — | 0.5 | 2 | 0.3 |
| Exemplary Embodiment 3 | 6 | 20 | 2 | 0.5 | 0.5 | — | 0.3 |
| Exemplary Embodiment 4 | 6 | 20 | — | 0.5 | 0.5 | 2 | 0.3 |

In detail, the multilayer of titanium/copper was overetched (O/E) for the gate electrode by 200% and the source/drain (S/D) electrode by 300% with respect to time to respectively estimate the etching speed, the CD skew, and the taper angle of the etchants of the exemplary embodiments.

Also, a side cross-sectional view of the etched copper layer was observed through a scanning electron microscope photograph.

The results are represented in Table 2 and FIG. 7, FIG. 8, FIG. 9 and FIG. 10.

TABLE 2

| | Copper etching ending point (seconds) | Gate CD skew (μm) | Gate taper angle (degrees) | S/D CD skew (μm) | S/D taper angle (degrees) |
|---|---|---|---|---|---|
| Exemplary Embodiment 1 | 15 | 0.6 | 50 | 0.9 | 45 |
| Exemplary Embodiment 2 | 13 | 0.5 | 40 | 1.0 | 35 |
| Exemplary Embodiment 3 | 15 | 0.9 | 40 | 1.3 | 35 |
| Exemplary Embodiment 4 | 20 | 0.6 | 50 | 1.0 | 40 |

An etching ending point means a state in which the etching of the single layer of copper is completed by the etchant such that the glass of the glass substrate is exposed.

As the value of the etching ending point decreases, it means better etching capacity and a faster etching speed.

The cut dimension (CD) skew means a distance between an end of the photoresist and an end of the copper, and must be in an appropriate range to obtain uniform taper etching without a step.

The taper angle is the inclination of the side surface of the etched metal layer, and a range of about 45 degrees to about 60 degrees is appropriate.

As shown in Table 2, the etchants according to exemplary embodiments of the present invention have excellent etching speed and CD skew, and may control the taper profile to about 35 degrees to 50 degrees.

Also, as shown in FIG. 7, FIG. 8, FIG. 9 and FIG. 10, the linearity of the pattern is excellent and the stability is good.

Etchants according to exemplary embodiments of the present invention were manufactured according to Exemplary Embodiment 5, Exemplary Embodiment 6, Exemplary Embodiment 7, Exemplary Embodiment 8, Exemplary Embodiment 9, and Exemplary Embodiment 10 in Table 3, and etching performances thereof were compared.

Compared with Exemplary Embodiment 1, Exemplary Embodiment 2, Exemplary Embodiment 3 and Exemplary Embodiment 4, the contents of the organic acid 1, the ammonium salt, and the glycol-based compound were changed, and they were measured.

Components of Exemplary Embodiment 5, Exemplary Embodiment 6, Exemplary Embodiment 7, Exemplary Embodiment 8, Exemplary Embodiment 9, and Exemplary Embodiment 10 are represented in Table 3, and all numbers are wt % units.

The organic acid 1 corresponds to citric acid, and the organic acid 2 corresponds to glycolic acid.

TABLE 3

| | APS | Organic acid 1 | Organic acid 2 | Ammonium salt | Fluorine-containing compound | Glycol-based compound | Azole-based compound |
|---|---|---|---|---|---|---|---|
| Exemplary Embodiment 5 | 6 | 0.1 | 2 | 0.5 | 0.5 | 2 | 0.3 |
| Exemplary Embodiment 6 | 6 | 30 | 2 | 0.5 | 0.5 | 2 | 0.3 |
| Exemplary Embodiment 7 | 6 | 20 | 2 | 0.01 | 0.5 | 2 | 0.3 |
| Exemplary Embodiment 8 | 6 | 20 | 2 | 5 | 0.5 | 2 | 0.3 |
| Exemplary Embodiment 9 | 6 | 20 | 2 | 0.5 | 0.5 | 0.01 | 0.3 |
| Exemplary Embodiment 10 | 6 | 20 | 2 | 0.5 | 0.5 | 10 | 0.3 |

In detail, the multilayer of titanium/copper was over-etched for the gate electrode by 200% and the source/drain (S/D) electrode by 300% with respect to time to respectively estimate the etching speed, the CD skew, and the taper angle of the etchants of the exemplary embodiments.

Also, a side cross-sectional view of the etched copper layer was observed through a scanning electron microscope photograph.

The results are represented in Table 4 and FIG. 11, FIG. 12, FIG. 13, FIG. 14, FIG. 15 and FIG. 16.

TABLE 4

| | Copper etching ending point (seconds) | Gate CD skew (μm) | Gate taper angle (degrees) | S/D CD skew (μm) | S/D taper angle (degrees) |
|---|---|---|---|---|---|
| Exemplary Embodiment 5 | 40 | 1.0 | 65 | 0.6 | 60 |
| Exemplary Embodiment 6 | 8 | 1.2 | 75 | 1.4 | 60 |
| Exemplary Embodiment 7 | 12 | 0.7 | 30 | 1.0 | 40 |
| Exemplary Embodiment 8 | 40 | 0.7 | 70 | 1.0 | 55 |
| Exemplary Embodiment 9 | 15 | 1.0 | 30 | 1.2 | 35 |
| Exemplary Embodiment 10 | 20 | 0.5 | 70 | 0.6 | 65 |

As shown in Table 4, when including the organic acid 1 at 0.1 wt % in Exemplary Embodiment 5, the value of the copper etching ending point was very high such that the organic acid did not perform a role as an oxidant, and when including the organic acid 1 at 30 wt % in Exemplary Embodiment 6, the value of the copper etching ending point was very small such that the copper layer was quickly etched and thereby the wiring may be easily disconnected.

When including the ammonium salt at 0.01 wt % in Exemplary Embodiment 7, the gate taper angle was small and the control of the etching speed was difficult, and when including the ammonium salt at 5 wt % in Exemplary Embodiment 8, the value of the copper etching ending point was very high such that the etching of the copper layer was non-uniform or the copper layer may not be etched.

When including the glycol-based compound at 0.01 wt % in Exemplary Embodiment 9, the gate taper angle became small and the control of the etching speed was difficult, and when including the glycol-based compound at 10 wt % in Exemplary Embodiment 10, the source/drain CD skew became small and the etching of the copper layer was difficult.

Referring to Exemplary Embodiment 5, Exemplary Embodiment 6, Exemplary Embodiment 7, Exemplary Embodiment 8, Exemplary Embodiment 9, and Exemplary Embodiment 10, the metal wiring etchant according to an exemplary embodiment of the present invention preferably includes the organic acid at 0.1 wt % to 30 wt %, the ammonium salt at 0.01 wt % to 5 wt %, and the glycol-based compound at 0.01 wt % to 10 wt %.

Also, the etchant according to Exemplary Embodiment 1 of the present invention was manufactured to estimate the etching performance for storage stability and number of treatments.

The storage stability was determined at room temperature of 25° C. for 7 days, and the number of treatments was estimated by increasingly contaminating Exemplary Embodiment 1 with copper ions each hour by 350 ppm over a span of 12 hours.

Table 5 shows estimation results of the storage stability, and Table 6 shows etching results for the number of treatments.

TABLE 5

| Layer | Etch characteristic | 0 days | 3 days | 5 days | 7 days |
|---|---|---|---|---|---|
| Gate | Cu EPD | 15 sec | 15 sec | 15 sec | 15 sec |
|  | 200% O/E C/D skew | 0.619 μm | 0.738 μm | 0.738 μm | 0.715 μm |
|  | Taper angle | 50 degrees | 61 degrees | 59 degrees | 61 degrees |
| S/D | Cu EPD | 16 sec | 16 sec | 16 sec | 16 sec |
|  | 300% O/E C/D skew | 0.902 μm | 0.920 μm | 0.932 μm | 0.932 μm |
|  | Taper angle | 45 degrees | 45 degrees | 42 degrees | 40 degrees |

As shown in Table 5 and FIG. 17, the etchant according to an exemplary embodiment of the present invention does not generate degradation in etching characteristics after room temperature storage of 7 days such that the initial performance may be maintained.

TABLE 6

| Layer | Etch characteristic | 0 ppm/0 hr | 1000 ppm/3 hr | 2000 ppm/3 hr | 3000 ppm/3 hr | 4000 ppm/3 hr |
|---|---|---|---|---|---|---|
| Gate | Cu EPD | 15 sec | 15 sec | 15 sec | 15 sec | 15 sec |
|  | 200% O/E C/D skew | 0.619 μm | 0.633 μm | 0.625 μm | 0.602 μm | 0.679 μm |
|  | Taper angle | 50 degrees | 61 degrees | 50 degrees | 52 degrees | 48 degree |
| S/D | Cu EPD | 16 sec | 16 sec | 16 sec | 16 sec | 17 sec |
|  | 300% O/E C/D skew | 0.902 μm | 0.879 μm | 0.914 μm | 0.896 μm | 0.926 μm |
|  | Taper angle | 45 degrees | 43 degrees | 40 degrees | 41 degrees | 40 degrees |

As shown in Table 6 and FIG. 18, the etchant according to an exemplary embodiment of the present invention does not generate degradation in the etching characteristics after the concentration of the copper ions reaches 4000 ppm such that the initial performance may be maintained even when many titanium/copper multilayers are etched.

A method of manufacturing the metal wiring according to another exemplary embodiment of the present invention includes forming a single layer including copper or a is multilayer including titanium and copper on a substrate, and etching the single layer or the multilayer by using the etchant.

The etchant may be the above-described etchant according to an exemplary embodiment of the present invention.

The single layer or the multilayer formed on the substrate may be used as a gate line or a data line in the thin film transistor array panel, and particularly when the gate line or the data line is made of the titanium/copper multilayer, the multilayer is etched in conjunction by using the etchant according to an exemplary embodiment of the present invention. That is, the copper layer and the titanium layer of the multilayer may be simultaneously etched using the etchant.

Here, the titanium layer is the lower layer and the copper layer is the upper layer.

According to exemplary embodiments of the present invention, hydrogen peroxide is not used such that copper may be taper-etched with good speed without heat generation, without the stability deterioration of the etchant, and without the addition of the expensive solution stabilizer, such that the stability of the etchant may be ensured, the performance of the etchant may be maintained for a long time, and the margin under the etching process may be sufficiently obtained, such that the cost may be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An etchant, comprising:
   ammonium persulfate;
   an organic acid;
   an ammonium salt;
   a fluorine-containing compound;
   a glycol-based compound; and
   an azole-based compound.

2. The etchant of claim 1, wherein
   the ammonium salt is present in a range from 0.01 wt % to 5 wt % of the etchant.

3. The etchant of claim 2, wherein
   the ammonium salt comprises at least one of $CH_3COONH_4$, $NH_4NO_3$, $(NH_4)_2HPO_4$, $NH_4H_2PO_4$, $NH_4PO_4$, $(NH_4)_2SO_4$, or any combination thereof.

4. The etchant of claim 1, wherein
the glycol-based compound is present in a range from 0.01 wt % to 10 wt % of the etchant.

5. The etchant of claim 4, wherein
the glycol-based compound comprises a compound represented by $R_1R_2H$, where $R_1$ is OH or $CH_3(CX_2)_nO$, X is one of H, OH, and $CH_3$, n is 0 to 7, $R_2$ is $(CH_2CH_2O)_m$ or $(CHCH_3CH_2O)_m$, and m is 1 to 8.

6. The etchant of claim 1, wherein
the organic acid is present in a range from 0.1 wt % to 30 wt % of the etchant.

7. The etchant of claim 6, wherein
the organic acid comprises at least one of oxalic acid, oxalacetic acid, fumaric acid, malic acid, succinic acid, acetic acid, butyric acid, palmitic acid, tartaric acid, ascorbic acid, uric acid, sulphonic acid, sulfinic acid, formic acid, citric acid, isocitric acid, α-ketoglutaric acid, glycolic acid, or any combination thereof.

8. The etchant of claim 1, wherein
the ammonium persulfate is present in a range from 0.1 wt % to 30 wt % of the etchant, the fluorine-containing compound is present in a range from 0.01 wt % to 5 wt % of the etchant, and the azole-based compound is present in a range from 0.01 wt % to 2 wt % of the etchant.

9. The etchant of claim 8, wherein
the fluorine-containing compound comprises at least one of HF, NaF, $NaHF_2$, $NH_4F$, $NH_4HF_2$, $NH_4BF_4$, KF, $KHF_2$, $AlF_3$, $HBF_4$, $LiF_4$, $KBF_4$, $CaF_2$, or any combination thereof.

10. The etchant of claim 9, wherein
the azole-based compound comprises at least one of benzotriazole, aminotetrazole, aminotetrazole of potassium salt, imidazole, pyrazole, or any combination thereof.

11. The etchant of claim 1, wherein
the metal wiring comprises a copper layer, a copper alloy layer, or a titanium/copper multilayer.

12. The etchant of claim 1, wherein
the ammonium persulfate is present in a range from 0.1 wt % to 30 wt % of the etchant, the organic acid is present in a range from 0.1 wt % to 30 wt % of the etchant, the ammonium salt is present in a range from 0.01 wt % to 5 wt % of the etchant, the fluorine-containing compound is present in a range from 0.01 wt % to 5 wt % of the etchant, the glycol-based compound is present in a range from 0.01 wt % to 10 wt % of the etchant, and the azole-based compound is present in a range from 0.01 wt % to 2 wt % of the etchant.

13. The etchant of claim 12, further comprising water as a remaining part.

14. A method of manufacturing metal wiring, comprising:
forming a single layer comprising copper or a multilayer comprising titanium and copper on a substrate; and
etching the single layer or the multilayer by using an etchant,
wherein the etchant comprises ammonium persulfate, an organic acid, an ammonium salt, a fluorine-containing compound, a glycol-based compound, and an azole-based compound.

15. The method of claim 14, wherein
the multilayer comprises a lower layer comprising titanium and an upper layer comprising copper, and
etching comprises simultaneously etching the upper layer and the lower layer of the multilayer by the etchant.

16. The method of claim 14, wherein
in the etchant, the ammonium persulfate is present in a range from 0.1 wt % to 30 wt %, the organic acid is present in a range from 0.1 wt % to 30 wt %, the ammonium salt is present in a range from 0.01 wt % to 5 wt %, the fluorine-containing compound is present in a range from 0.01 wt % to 5 wt %, the glycol-based compound is present in a range from 0.01 wt % to 10 wt %, and the azole-based compound is present in a range from 0.01 wt % to 2 wt %.

17. The method of claim 16, wherein
the ammonium salt comprises at least one of $CH_3COONH_4$, $NH_4NO_3$, $(NH_4)_2HPO_4$, $NH_4H_2PO_4$, $NH_4PO_4$, $(NH_4)_2SO_4$, or any combination thereof.

18. The method of claim 17, wherein
the glycol-based compound comprises a compound represented by $R_1R_2H$, where $R_1$ is OH or $CH_3(CX_2)_nO$, X is one of H, OH, and $CH_3$, n is 0 to 7, $R_2$ is $(CH_2CH_2O)_m$ or $(CHCH_3CH_2O)_m$, and m is 1 to 8.

19. The method of claim 18, wherein
the organic acid comprises at least one of oxalic acid, oxalacetic acid, fumaric acid, malic acid, succinic acid, acetic acid, butyric acid, palmitic acid, tartaric acid, ascorbic acid, uric acid, sulphonic acid, sulfinic acid, formic acid, citric acid, isocitric acid, α-ketoglutaric acid, glycolic acid, and any combination thereof.

20. The method of claim 19, wherein
the fluorine-containing compound comprises at least one of HF, NaF, $NaHF_2$, $NH_4F$, $NH_4HF_2$, $NH_4BF_4$, KF, $KHF_2$, $AlF_3$, $HBF_4$, $LiF_4$, $KBF_4$, $CaF_2$, and any combination thereof.

21. The method of claim 20, wherein
the azole-based compound comprises at least one of benzotriazole, aminotetrazole, aminotetrazole of potassium salt, imidazole, pyrazole, and any combination thereof.

* * * * *